United States Patent
Jang et al.

(10) Patent No.: US 9,048,348 B2
(45) Date of Patent: Jun. 2, 2015

(54) METHOD OF SEPARATING SUBSTRATE AND METHOD OF FABRICATING SEMICONDUCTOR DEVICE USING THE SAME

(71) Applicant: Seoul Viosys Co., Ltd., Ansan-si (KR)

(72) Inventors: Jong Min Jang, Ansan-si (KR); Hwa Mok Kim, Ansan-si (KR); Kyu Ho Lee, Ansan-si (KR); Chang Hoon Kim, Ansan-si (KR); Daewoong Suh, Ansan-si (KR); Chi Hyun In, Ansan-si (KP); Dae Seok Park, Ansan-si (KR); Jong Hyeon Chae, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/138,923

(22) Filed: Dec. 23, 2013

(65) Prior Publication Data

US 2014/0179043 A1    Jun. 26, 2014

(30) Foreign Application Priority Data

Dec. 26, 2012  (KR) ........................ 10-2012-0153008

(51) Int. Cl.
*H01L 21/30* (2006.01)
*H01L 33/00* (2010.01)
*H01L 33/22* (2010.01)

(52) U.S. Cl.
CPC .......... *H01L 33/0079* (2013.01); *H01L 33/0075* (2013.01); *H01L 33/007* (2013.01); *H01L 33/0095* (2013.01); *H01L 33/22* (2013.01)

(58) Field of Classification Search
CPC .............. H01L 21/84; H01L 21/76264; H01L 21/76289; H01L 21/76298; H01L 33/0079
USPC .............. 438/33, 68, 113, 114, 455, 458, 464
See application file for complete search history.

(56) References Cited

U.S. PATENT DOCUMENTS

| | | | | |
|---|---|---|---|---|
| 7,855,397 | B2 * | 12/2010 | Alley et al. | 257/99 |
| 2006/0289052 | A1 * | 12/2006 | O'Quinn et al. | 136/230 |
| 2009/0181520 | A1 * | 7/2009 | Li et al. | 438/462 |
| 2011/0180873 | A1 * | 7/2011 | Yoo | 257/348 |

\* cited by examiner

*Primary Examiner* — Kevin M Picardat
(74) *Attorney, Agent, or Firm* — H.C. Park & Associates, PLC

(57) ABSTRACT

A method of fabricating a semiconductor device, the method including: forming a first mask pattern including a masking region and an open region on a substrate; forming a sacrificial layer to cover the substrate and the first mask pattern; patterning the sacrificial layer to form a seed layer and to expose the first mask pattern; forming a second mask pattern on the exposed first mask pattern; forming an epitaxial layer on the seed layer and the second mask pattern, and forming a void between the second mask pattern and the epitaxial layer; and separating the substrate from the epitaxial layer.

23 Claims, 4 Drawing Sheets

METHOD OF SEPARATING SUBSTRATE AND METHOD OF FABRICATING SEMICONDUCTOR DEVICE USING THE SAME

CROSS-REFERENCE TO RELATED APPLICATION

This application claims priority from and the benefit of Korean Patent Application No. 10-2012-0153008, filed on Dec. 26, 2012, which is hereby incorporated by reference for all purposes as if fully set forth herein.

BACKGROUND

1. Field

Aspects of the present invention relate to a method of separating a substrate and a method of fabricating a semiconductor device using the same, in which a sacrificial layer is patterned to form a void between a substrate and an epitaxial layer.

2. Discussion of the Background

A light emitting diode is an inorganic semiconductor device that emits light through the recombination of electrons and holes, and has recently been used in various fields, such as displays, vehicle lamps, lighting, and the like. Light emitting diodes may be classified into lateral light emitting diodes and vertical light emitting diodes according to the locations of electrodes.

Although the lateral light emitting diode is fabricated by a relatively simple method, the lateral light emitting diode has a problem in that a light emitting area is decreased, since a part of an active layer is removed for the formation of an electrode of a lower semiconductor layer. In addition, a p-type electrode and an n-type electrode of the lateral light emitting diode are arranged horizontally, thereby causing current crowding and lowering the luminous efficacy of the light emitting diode. Further, a sapphire substrate having low thermal conductivity is most widely used as a growth substrate of the lateral light emitting diode. However, the lateral light emitting diode having such a sapphire substrate has difficulty dissipating heat. Accordingly, junction temperature of light emitting diode is increased, thereby lowering internal quantum efficiency of the light emitting diode.

To solve the foregoing problems of lateral light emitting diodes, vertical light emitting diodes have been developed. In the vertical light emitting diode, electrodes are arranged in a vertical direction, and a growth substrate such as a sapphire substrate is separated from a semiconductor layer, thereby overcoming the foregoing problems of the lateral light emitting diode.

The vertical light emitting diode requires an additional process for separating the growth substrate, since the electrodes are arranged in the vertical direction. In general, a laser lift-off (LLO) process is used for separating the growth substrate. However, when the laser lift-off process is used to separate the growth substrate, the semiconductor layer can suffer from cracking due to the high energy of a laser beam. Further, when the growth substrate and the semiconductor layer are made of a homogeneous material (for example, a gallium nitride-based semiconductor layer and a gallium nitride substrate), it is difficult to apply the laser lift-off process due to small difference in energy band gap between the growth substrate and the semiconductor layer.

To solve such problems in the laser lift-off process of separating the growth substrate, a chemical lift-off (CLO) process, a stress lift-off (SLO) process, and the like, have been recently developed. In the chemical lift-off process, an etching solution infiltrates through a channel (in general, a void) formed between the semiconductor layer and the growth substrate such that the semiconductor layer and the growth substrate can be separated from each other. In the stress lift-off process, stress is applied after weakening coupling between the semiconductor layer and the growth substrate, such that the semiconductor layer and the growth substrate can be separated from each other.

To use the chemical lift-off process for separating the growth substrate, a method of forming a channel through which the etching solution can be infiltrated between the growth substrate and the semiconductor layer is used. For example, a sacrificial layer is formed between the semiconductor layer and the growth substrate, and a mask pattern is formed on the sacrificial layer. Then, the sacrificial layer is partially removed by electro-chemical etching (ECE), thereby forming a void in the sacrificial layer. Parts of the sacrificial layer arranged under a region not covered with the mask pattern are etched to form voids. The voids may be used as a transfer channel for the etching solution.

However, since the void has only a width of several micrometers, the etching solution supplied into the voids has a very slow etching rate. For example, in the chemical lift-off process, a buffered oxide etchant (BOE) employed as the etching solution is transferred at an etching rate of dozens of micrometers per hour, when the voids are used as the channel. Thus, it takes a long time to separate a 2 inch thickness substrate using the etching solution, and such void forming method is not suitable for separation of a large substrate.

Moreover, the method of forming voids using ECE has low reproducibility. As a result, the process of separating a substrate has low reproducibility and reliability, thereby lowering process yield.

SUMMARY

Aspects of the present invention provide a method of separating a substrate, in which an etching solution is easily passed through a void having an increased size when the substrate is separated by a chemical lift-off process.

In addition, aspects of the present invention provide a method of separating a substrate using a stress lift-off process through a void having an increased size.

Further, aspects of the present invention provide a method of fabricating a semiconductor device, in which a substrate can be separated through a large area using the foregoing methods of separating a substrate.

In accordance with one aspect of the invention, a method of separating a substrate comprises: forming a first mask pattern including a masking region and an open region on a substrate; forming a sacrificial layer to cover the substrate and the first mask pattern; patterning the sacrificial layer to form a seed layer and expose the first mask pattern; forming a second mask pattern exposed the first mask pattern; forming an epitaxial layer on the seed layer and the second mask pattern and forming a void between the second mask pattern and the epitaxial layer; and separating the substrate from the epitaxial layer.

The seed layer may be formed on a portion of the masking region.

In addition, the seed layer may be thicker than the second mask pattern.

The epitaxial layer may be grown using the seed layer as a seed.

In addition, a width of the seed layer may be smaller than a width of the masking region of the first mask pattern.

In some embodiments, the patterning the sacrificial layer to form a seed layer may comprise forming a separation layer, and the separation layer may be formed within the open region.

Further, the second mask pattern may cover the separation layer.

The separating the substrate may comprise chemically etching the first and second mask patterns using an etching solution.

As the void has an increased size, it is possible to reduce time required to etch the mask patterns. As such, time required to separate the substrate is reduced, thereby enabling large-area separation of a substrate.

The separating the substrate may comprise applying stress between the substrate and the epitaxial layer.

In some embodiments, the method may further comprises forming an etching mask pattern on the sacrificial layer while patterning the sacrificial layer to form a seed layer, and etching the sacrificial layer using the etching mask pattern as an etching mask, wherein the second mask pattern may be formed by a lift-off process using the etching mask pattern.

In accordance with another aspect of the invention, a method of fabricating a semiconductor device comprises: forming a first mask pattern including a masking region and an open region, on a substrate; forming a sacrificial layer to cover the substrate and the first mask pattern; patterning the sacrificial layer to form a seed layer and expose the first mask pattern; forming a second mask pattern on the exposed first mask pattern; forming an epitaxial layer on the seed layer and the second mask pattern, and forming a void between the second mask pattern and the epitaxial layer; forming a support substrate on the epitaxial layer; and separating the substrate from the epitaxial layer.

The seed layer may be formed on a portion of the masking region, and a separation layer may be further formed within the open region while patterning the sacrificial layer to form the seed layer.

In addition, the seed layer may be thicker than the second mask pattern.

The epitaxial layer may be grown from the seed layer as a seed, and the epitaxial layer may comprise a first nitride semiconductor layer, an active layer and a second nitride semiconductor layer.

Further, the sacrificial layer may comprise u-GaN or n-GaN.

The separating the substrate may comprise chemically etching the first and second mask patterns using an etching solution.

The separating the substrate may comprise applying stress between the substrate and the epitaxial layer.

As such, according to various embodiments of the invention, it is possible to separate a large substrate. Thus, it is possible to minimize defects in a semiconductor device manufactured by the fabrication method. Further, it is possible to prevent the fabricated semiconductor device from suffering from deterioration in efficiency and reliability.

The method may further comprise forming at least one dividing groove by patterning the epitaxial layer before forming a support substrate, wherein the epitaxial layer is divided into a plurality of semiconductor device regions by the at least one dividing groove.

The method may further comprise forming at least one device region dividing groove by patterning the respective semiconductor device regions after separating the substrate, wherein the semiconductor device region is divided into at least one device region by the device region dividing groove.

In some embodiments, the method may further comprise forming at least one device region dividing groove by patterning the epitaxial layer after separating the substrate, wherein the epitaxial layer is divided into at least one device region by the device region dividing groove.

The method may further comprise forming at least one light emitting diode chip by dividing the support substrate under the device region dividing groove.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Embodiments of the present invention will be described in more detail with reference to the accompanying drawings. It should be understood that the following embodiments are given by way of illustration only to provide thorough understanding of the invention to those skilled in the art. Therefore, the present invention is not limited to the following embodiments and may be embodied in different ways. Further, like components will be denoted by like reference numerals throughout the specification, and the widths, lengths, and thicknesses of certain elements, layers or features may be exaggerated for clarity.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

The embodiments of the invention described herein relate to nitride semiconductor layers that are grown on a substrate, which in turn is separated from the nitride semiconductor layers. In particular, the embodiments of the present invention disclose that the substrate is separated by a chemical lift-off or stress lift-off process, instead of a laser lift-off method. However, the present invention is not limited thereto, and may be applied to various processes for separation of the substrate.

In addition, the following embodiments disclose a method of fabricating a vertical semiconductor device by separating the substrate from the semiconductor layers. However, the present invention is not limited thereto, and may be applied to various methods of fabricating a semiconductor device. For example, the present invention may be applied to a method of fabricating a flip chip type semiconductor device from which a substrate is separated.

FIGS. 1(a) to 9 are sectional views explaining a method of separating a substrate and a method of fabricating a semiconductor device, according to various embodiments of the invention.

Referring to FIG. 1(a), a substrate 110 is prepared, and a first mask pattern 120 is formed on the substrate 110. The first mask pattern 120 may comprise a masking region and an open region (i.e., on or more openings), such that an upper surface of the substrate 110 is partially exposed through the open region.

There is no limit to the substrate 110, so long as nitride semiconductor layers 151, 153, 155 can be grown on the substrate 110. For example, the substrate 110 may comprise a sapphire substrate, a silicon carbide substrate, a silicon substrate, and the like. In particular, the substrate 110 may comprise a nitride substrate such as a gallium nitride substrate or aluminum nitride substrate.

The first mask pattern 120 may be formed by depositing a material including $SiO_2$, followed by patterning. Deposition may be performed by electron E-beam evaporation or other deposition methods. However, the present invention is not limited thereto. For example, the first mask pattern 120 may comprise various materials in addition to $SiO_2$, and may be formed by deposition and lift-off processes.

The first mask pattern 120 may have various patterns. For example, the first mask pattern 120 may be formed as a stripe pattern, a polygonal pattern, and the like. In addition, the first mask pattern 120 may be formed as a concave pattern or convex pattern. In this embodiment, the first mask pattern 120 will be described as a convex pattern.

Referring to FIG. 1(b), a sacrificial layer 130 is formed to cover the substrate 110 and the first mask pattern 120. The sacrificial layer 130 may comprise a nitride semiconductor, such as (Al, Ga, In)N. For example, the sacrificial layer 130 may comprise undoped GaN (u-GaN) and/or n-type GaN (n-GaN). Thus, the sacrificial layer 130 may be used as a seed layer for formation of an epitaxial layer 150 discussed below. In addition, the sacrificial layer 130 may be grown and formed by metal organic chemical vapor deposition (MOCVD), molecular beam epitaxy (MBE), hydride vapor phase epitaxy (HYPE), or the like. The sacrificial layer 130 may undergo epitaxial lateral overgrowth (ELO) while being grown. Therefore, the sacrificial layer 130 may be formed to cover all of the lateral and upper surfaces of the first mask pattern 120.

Referring to FIGS. 2(a)-2(d), the sacrificial layer 130 is patterned to form a seed layer 131 and a separation layer 133, and a second mask pattern 140 is formed. In particular, referring FIG. 2(a), an etching mask pattern 10 is formed on the sacrificial layer 130.

Any dry etching mask may be used for the etching mask pattern 10. For example, the etching mask pattern 10 may comprise a photoresist pattern. The etching mask pattern 10 may be formed on/over a portion of the masking region of the first mask pattern 120. In this embodiment, the etching mask pattern 10 may have a smaller width than corresponding portions of the first mask pattern 120. Advantageously, in terms of the following process, the etching mask pattern 10 is not formed directly above opens of the first mask pattern 120. However, the present invention is not limited thereto.

Referring to FIG. 2(b), the sacrificial layer 130 is patterned to form the seed layer 131 and the separation layer 133. The sacrificial layer 130 may be etched by using the etching mask pattern 10 as an etching mask. For example, the sacrificial layer 130 may be partially etched by a dry etching process such as reactive ion etching (RIE). As the sacrificial layer 130 is partially etched, the first mask pattern 120 may be partially exposed.

The sacrificial layer 130 arranged under the etching mask pattern 10 is not etched. Thus, a portion of the sacrificial layer 130, which is disposed under the etching mask pattern 10, remains to form the seed layer 131. In addition, the etching mask pattern 10 is formed on a portion of the masking region of the first mask pattern 120, and thus, the seed layer 131 is also formed on the masking region. Further, portions of the seed layer 131 may have a smaller width than corresponding portions the first mask pattern 120.

Etching of the sacrificial layer 130 may proceed until the upper surface of the first mask pattern 120 is exposed. Thus, a portion of the sacrificial layer 130 formed within the open region of the first mask pattern 120 remains after the patterning process, thereby forming the separation layer 133. That is, the separation layer 133 may be formed within the open region of the first mask pattern 120.

However, the present invention is not limited thereto, and the etching process may proceed until the sacrificial layer 130 is completely or substantially completely removed. In this case, the upper surface of the substrate 110 may be partially exposed through the open region. In other words, the separation layer 133 may be etched away.

Referring to FIGS. 2(c) and 2(d), the second mask pattern 140 is formed on a region to which the first mask pattern 120 is exposed. The second mask pattern 140 may be formed by the lift-off process.

Specifically, as shown in FIG. 2(c), a second mask pattern forming material 140a is deposited on the first mask pattern 120, the separation layer 133, and the etching mask pattern 10. The second mask pattern forming material 140a may be formed of a material including $SiO_2$, through a deposition process such as E-beam evaporation. In addition, the second mask pattern forming material 140a may be thinner than the seed layer 131.

Referring to FIG. 2(d), the etching mask pattern 10 is removed along with portions of the second mask pattern forming material 140a disposed thereon, thereby forming the second mask pattern 140. The etching mask pattern 10 may be removed by various methods. For example, if the etching mask pattern 10 is a photoresist pattern, the photoresist pattern may be removed by wet or dry etching.

Thus, the etching mask pattern 10 for patterning the sacrificial layer 130 is used in forming the second mask pattern 140, instead of being directly removed. Thus, processing can be simplified. In addition, the second mask pattern 140 may be formed without performing a patterning process.

The second mask pattern 140 is formed to cover a portion of the first mask pattern 120 and the separation layer 133. Thus, when the epitaxial layer 150 is subsequently formed, the second mask pattern 140 may prevent the separation layer 133 from acting as a seed layer. In other words, a semiconductor layer can be prevented from growing from the separation layer 133.

Figure 1:
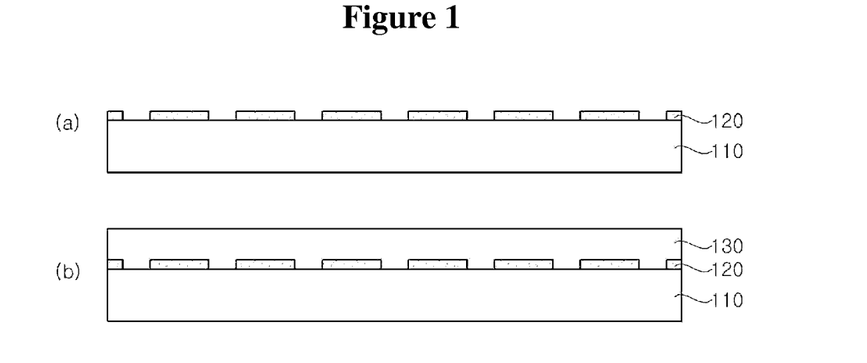
FIGS. 1(a), 1(b), 2(a), 2(b), 2(c), 2(d), 3, 4(a), 4(b), 5, 6, 7, 8, and 9 are sectional views explaining a method of separating a substrate and a method of fabricating a semiconductor device according to embodiments of the present invention.
Figure 2:
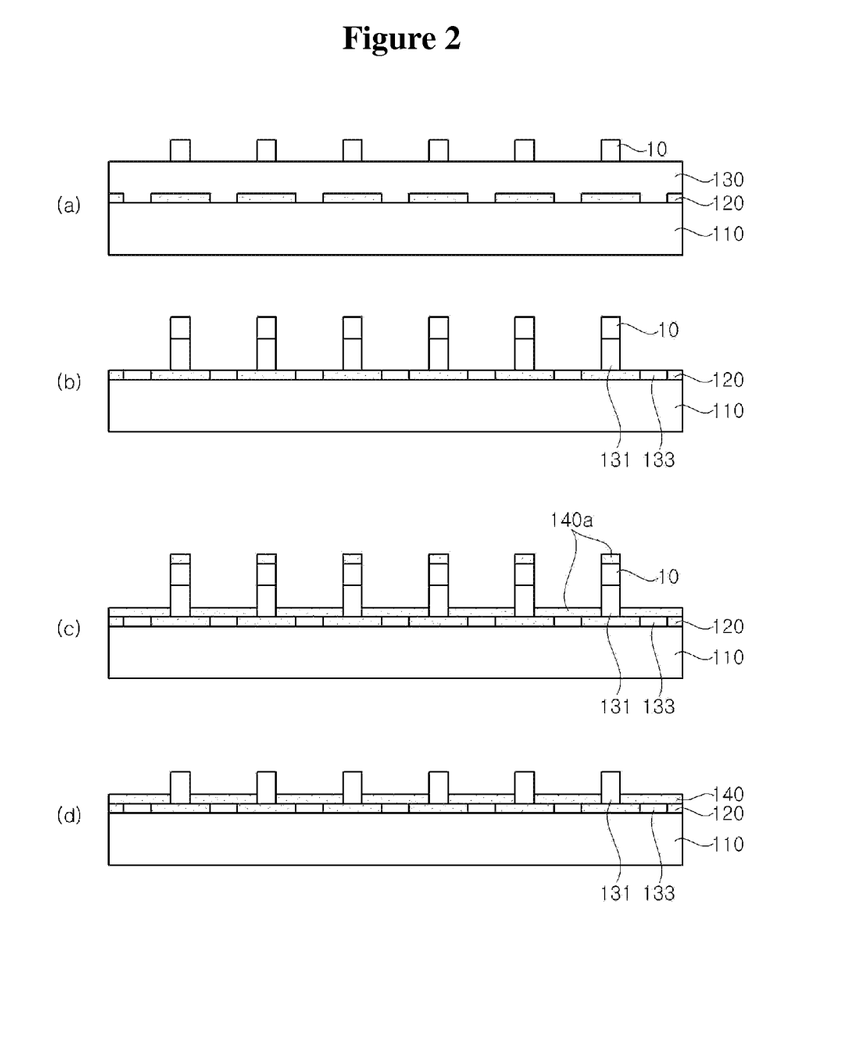
Figure 3:
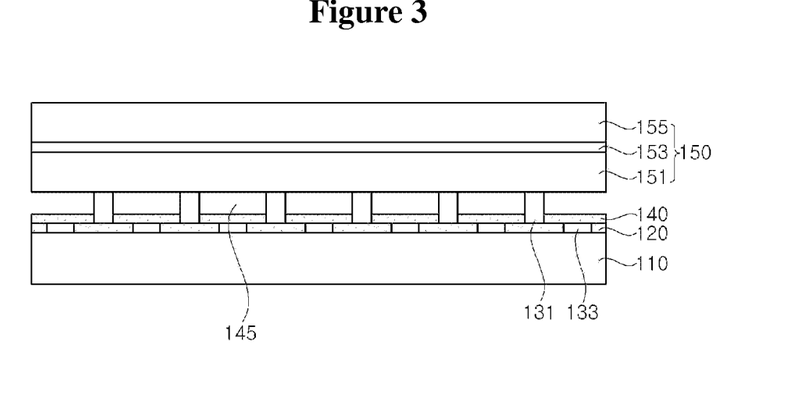
Figure 4:
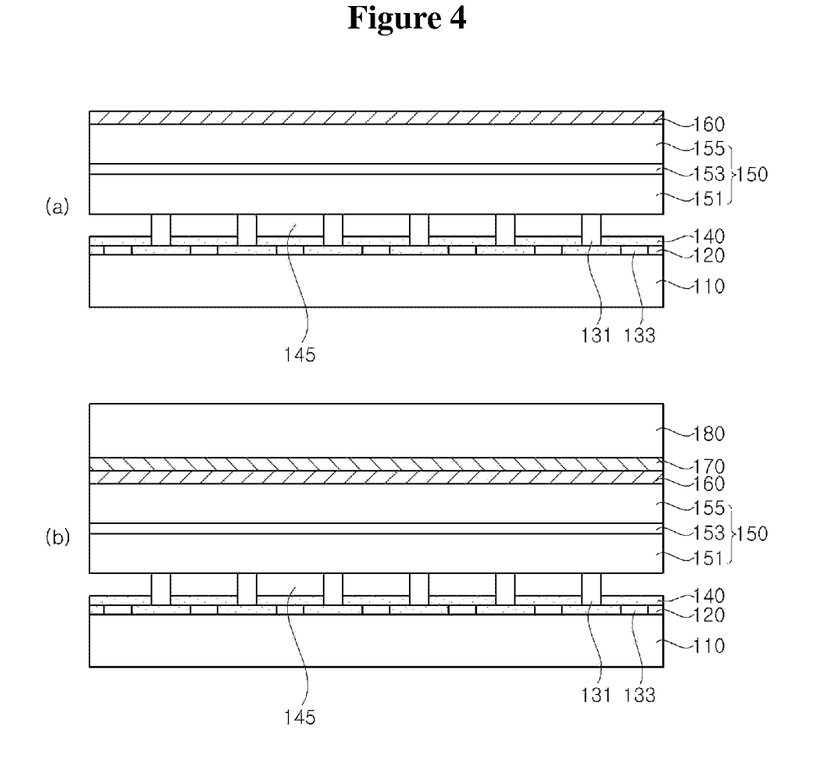

Referring to FIG. 3, the epitaxial layer 150 is formed on the seed layer 131 and the second mask pattern 140. The epitaxial layer includes a first nitride semiconductor layer 151, an active layer 153 and a second nitride semiconductor layer 155. A void 145 can be formed between the epitaxial layer 150 and the second mask pattern 140. The void 145 may be in the form of interconnected channels, or may include multiple separate voids.

The semiconductor layers 151, 153, 155 of the epitaxial layer 150 may be formed by MOCVD, MBE, HYPE, or the like. The semiconductor layers 151, 153, 155 may be grown using the seed layer 131 as a seed. While the epitaxial layer 150 is grown, the epitaxial layer may undergo horizontal growth (for example, ELO) as well as vertical growth. Therefore, the epitaxial layer 150 may be formed over the entirety of the substrate 110.

The first nitride semiconductor layer 151 is laterally grown from upper surfaces of two adjacent seed layers 131. During lateral growth, the first nitride semiconductor layer 151 grows from different portions of seed layer 131, to form a continuous layer. A distance between adjacent portions of the seed layer 131 may range from 1 µm to 50 µm, for example, from 3 µm to 10 µm.

As the first nitride semiconductor layer 151 is grown using the seed layer 131 as a seed, the void 145 may be surrounded by the upper surface of the second mask pattern 140, a side surface of the seed layer 131, and a lower surface of the first nitride semiconductor layer 151. As such, the void 145 can be formed when the seed layer 131 is thicker thickness than the second mask pattern 140. The height of the void 145 may be determined depending on the thickness of the seed layer 131 and the thickness of the second mask pattern 140. The width of the void 145 may be determined depending upon the width of the second mask pattern 140.

The sacrificial layer 130 is patterned to form the seed layer 131, and then the epitaxial layer 150 is formed using the seed layer 131 as a seed, thereby forming the void 145. Thus, it is possible to form the void 145 between the epitaxial layer 150 and the substrate 110, without using electrochemical etching (ECE). Further, the void 145 may have a larger size than a void formed by electrochemical etching. In addition, an etched portion of the sacrificial layer 130 is formed as the void 145 by a patterning process, instead of electrochemical etching, which has a low reproducibility, thereby significantly improving reproducibility of the process of forming the void 145.

Each of the semiconductor layers 151, 153, 155 of the epitaxial layer 150 may comprise, for example, an (Al, Ga, In)N layer. The first nitride semiconductor layer 151 and the second nitride semiconductor layer 155 may be formed of different conductivity type semiconductors. In this embodiment, the first nitride semiconductor layer 151 is an n-type semiconductor layer and the second nitride semiconductor layer 155 is a p-type semiconductor layer, or vice versa. The composition of the active layer 153 may be varied, so as to emit light having a desired wavelength.

The first nitride semiconductor layer 151 may comprise an undoped layer and a doped layer. When the first nitride semiconductor layer 151 is formed, the undoped layer is grown first, and then the doped layer is formed, whereby the first nitride semiconductor layer 151 can comprise multiple layers. Thus, the undoped layer is grown at an initial stage of forming the first nitride semiconductor layer 151, thereby improving crystallinity of the first nitride semiconductor layer 151. Further, crystallinity of the active layer 153 and the second nitride semiconductor layer 155 formed on the first nitride semiconductor layer 151 may also be improved. Herein, descriptions of details apparent to those skilled in the art with regard to the semiconductor layers 151, 153, 155 comprising the nitride semiconductor materials are omitted.

Referring to FIGS. 4(a) and 4(b), a support substrate 180 is formed on the epitaxial layer 150. Further, the method of fabricating a semiconductor device may further comprise forming a metal layer 160 and a bonding layer 170 between the support substrate 180 and the epitaxial layer 150.

First, referring to FIG. 4(a), the metal layer 160 is formed on the epitaxial layer 150. The metal layer 160 may comprise a reflective metal layer and a barrier metal layer. The barrier metal layer may be formed to cover the reflective metal layer.

The metal layer 160 may be formed by deposition and lift-off processes. The reflective metal layer may serve to reflect light emitted from the active layer 153, and may also serve as an electrode electrically connected to the epitaxial layer 150. Thus, the reflective metal layer may comprise a material having high reflectivity and providing good ohmic contact. The barrier metal layer prevents diffusion between the reflective metal layer and other materials. Thus, it is possible to prevent a reflectivity reduction and an increase in contact resistance, due to damage to the reflective metal layer.

For example, the reflective metal layer may comprise at least one metal selected from among Ni, Pt, Pd, Rh, W, Ti, Al, Ag, and Au. The barrier metal layer may comprise Ni, Cr, or Ti, and may be formed as multiple layers.

In addition, an edge etching process for removing the epitaxial layer 150 at edges of the substrate 110 may be further performed before forming the metal layer 160. Since some of the semiconductor layers 151, 153, 155 grown at the edges of the substrate 110 may have an unstable crystal structure, the crystallinity of the semiconductor layers can be deteriorated. At the edges where the crystallinity is relatively low, the semiconductor layers 151, 153, 155 can block transfer of an etching solution, by blocking a transfer channel for the etching solution upon separation of the substrate. However, according to various embodiments, edges of the semiconductor layers 151, 153, 155 are etched by the edge etching process, thereby preventing the aforementioned channel blocking phenomenon. Thus, it is possible to reduce the time required to separate the substrate.

Then, referring to FIG. 4(b), the support substrate 180 is formed on the metal layer 160. Further, the bonding layer 170 may be further formed to bond the support substrate 180 to the metal layer 160.

The support substrate 180 may comprise an insulating substrate, a conductive substrate, or a circuit substrate. For example, the support substrate 180 may comprise a sapphire substrate, a gallium nitride substrate, a glass substrate, a silicon carbide substrate, a silicon substrate, a metal substrate, a ceramic substrate, or a printed circuit board (PCB).

The bonding layer 170 may comprise a metallic material, for example, AuSn. The bonding layer including AuSn may form a eutectic bond between the support substrate 180 and the metal layer 160. When the support substrate 180 is a conductive substrate, the bonding layer electrically connects the metal layer 160 to the support substrate 180.

Figure 5:
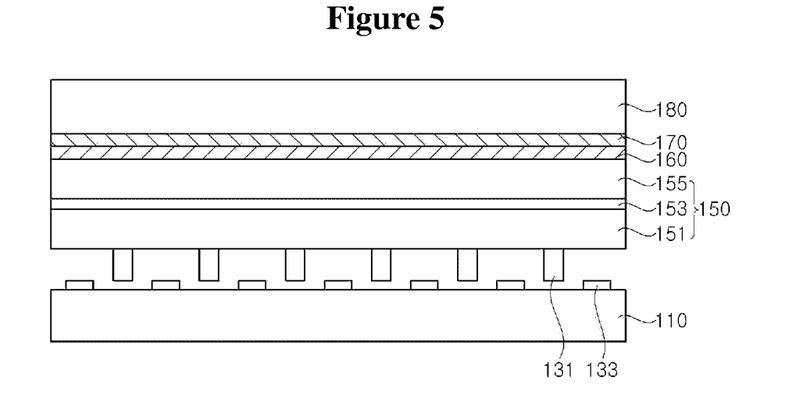

Referring to FIG. 5, the substrate 110 is separated from the epitaxial layer 150. Separation of the substrate 110 may comprise chemical etching of the first and second mask patterns 120 and 140, using an etching solution.

Chemical etching may be performed using the etching solution, such as a buffered oxide etchant (BOE), HF or the like. The etching solution infiltrates between the substrate 110 and the epitaxial layer 150, via the void 145 and the masking regions of the first and second mask patterns 120, 140, which are used as transfer channels.

The void 145 has a larger size than a conventional void, thereby improving the etching rate of the mask patterns 120, 140. Therefore, it is possible to reduce the time required to separate the substrate, and it is also possible to enable large-area separation of a substrate. Furthermore, it is possible to prevent the active layer 153 from being damaged by the etching solution, since the time the side surfaces of the active layer 153 are exposed to the etching solution is relatively reduced, when the substrate is separated. Accordingly, a manufactured semiconductor device can be prevented from being deteriorated in efficiency and reliability.

In addition, separation of the substrate 110 may further comprise etching and removing the mask pattern 130 and applying stress thereto. Alternatively, the substrate may be removed by applying stress between the substrate 110 and the epitaxial layer 150, without removing the first and second mask patterns 120, 140. That is, separation of the substrate 110 may be performed using the stress lift-off process.

The epitaxial layer 150 and the substrate 110 are bonded to each other by the seed layer 131. This causes a bonding area between the epitaxial layer 150 and the substrate 110 to be decreased, as compared with conventional methods. Thus, the substrate 110 can be easily separated from the epitaxial layer 151 by applying stress to the seed layer 131 and without removing the mask patterns 120, 140.

The seed layer 131 may be removed by dry etching or the like, after separating the substrate. When the seed layer 131 is removed by dry etching, an uneven pattern corresponding to the pattern of the seed layer 131 may be formed on the first nitride semiconductor layer 151. However, the present invention is not limited thereto, and the seed layer 131 may be partially removed when the seed layer comprises n-GaN.

After separating the substrate 110, the surface of the first nitride semiconductor layer 151 may be cleaned with hydrochloric acid or the like. In addition, when the first nitride semiconductor layer 151 comprises the undoped layer, the undoped layer may be removed by dry etching or the like.

Figure 6:
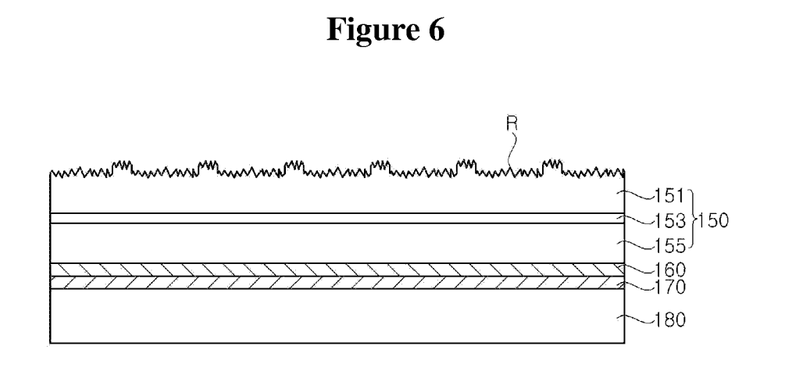

Referring to FIG. 6, a roughened surface R may be formed on the first nitride semiconductor layer 151. Due to the roughened surface R, extraction efficiency of light emitted from the active layer 153 can be improved. The roughened surface R may be formed by a wet etching method, such as photo enhanced chemical etching (PEC) and the like.

Figure 7:
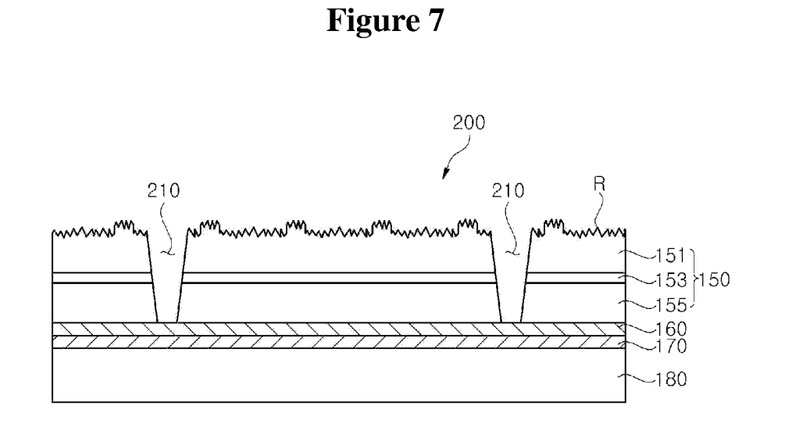

Referring to FIG. 7, the epitaxial layer 150 is patterned to form at least one device region dividing groove 210. Patterning of the epitaxial layer 150 may be performed by photolithography and/or etching. Since the at least one device region dividing groove 210 is formed, the epitaxial layer 150 may be separated into at least one device region 200.

While separating the substrate, chipping (due to breaking or damage) can occur at an edge of the semiconductor layer contacting the substrate, due to concentrations of stress. In particular, conventionally, the epitaxial layer is separated into the device region, in order to reduce time require to etch the mask pattern, before separating the substrate. As a result, the semiconductor layer in the device region is damaged, thereby lowering efficiency and reliability of the semiconductor device.

However, according to various embodiments, the void 145 is enlarged, thereby allowing the mask patterns 120, 140 to be removed within a relatively short time and without dividing the epitaxial layer 150 into the device regions. Therefore, the embodiments of the present invention enable large-area separation of the substrate 110 from the epitaxial layer 150. That is, after separating the substrate 110, the epitaxial layer 150 may be separated into the device region 200. Accordingly, upon separation of the substrate, chipping or damage possibly occurs only at the edges of the epitaxial layer 150, and the semiconductor layers 151, 153, 155 of the device regions 200 inside the epitaxial layer 150 are not damaged. Therefore, it is possible to minimize damage to a light emitting diode chip 300 fabricated from the device region 300, and to prevent efficiency and reliability of the light emitting diode from being reduced. In addition, according to various embodiments, it is possible to improve overall process yield.

Figure 8:
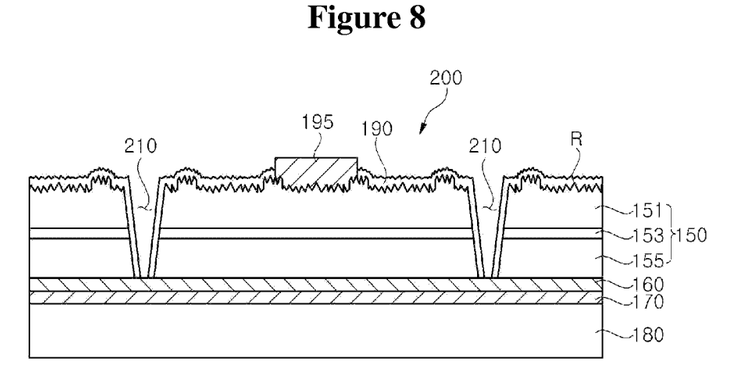

Referring to FIG. 8, a passivation layer 190 and an electrode 195 are formed to cover the device region 200. The passivation layer 190 protects the device region 200 from an exterior environment. The passivation layer 190 may be formed on the sides of the device region 200. In addition, a portion of the passivation layer 181 formed on the roughened surface R may be more smoothly formed than the roughened surface R.

The passivation layer 190 may comprise $TiO_2$, $Al_2O_3$, or $SiN_x$, and may also be formed as a multilayered structure including $SiO_2$ or $SiN_x$. In addition, the passivation layer 190 arranged on a lateral surface of the device region 200 may be formed as a distributed Bragg reflector (DBR) in which $SiO_2$ and $TiO_2$ layers are alternately stacked one above another. In this case, the DBR may reflect light, whereby most light can be emitted to the outside through an upper surface of the device region 200.

The electrode 195 may be formed on the first nitride semiconductor layer 151. Further, the passivation layer 190 may be partially removed to expose the device region 200, before forming the electrode 195, thereby forming an electrode forming region. The electrode 195 may comprise an electrode pad and an electrode extension, thereby improving current spreading.

Figure 9:
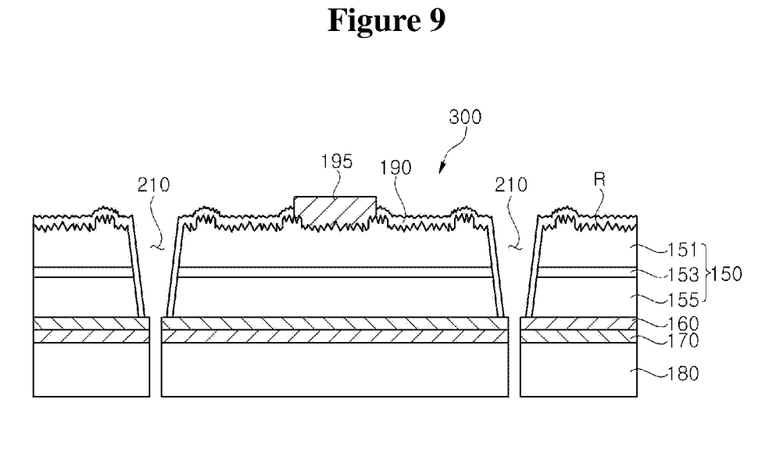

Referring to FIG. 9, the support substrate 180, the metal layer 160 and the bonding layer 170, which are arranged under the device region dividing groove 210, are divided to provide at least one light emitting diode chip 300. The support substrate 180, the metal layer 160 and the bonding layer 170 may be divided by laser scribing or the like.

Alternatively, other embodiments of the present invention may further comprise forming at least one dividing groove (not shown) by patterning the epitaxial layer 150 before forming the support substrate. The epitaxial layer 150 may be separated into a plurality of semiconductor device regions (not shown) by the at least one dividing groove.

Each of the semiconductor device regions has a larger area than the device region 200, and a plurality of device regions 200 may also be formed from the semiconductor device region.

In the foregoing embodiments shown in FIGS. 1(a) to 9, the substrate 110 is separated from the epitaxial layer 150 without dividing the epitaxial layer 150. In this embodiment, however, the epitaxial layer 150 is divided into at least one semiconductor device region before forming the support substrate 180. Thus, when the mask patterns 120, 140 are subjected to chemical etching, at least one dividing groove may be used as a transfer channel for the etching solution. Therefore, it is possible to further reduce the time required to etch the mask patterns 120, 140 via chemical etching.

According to aspects of the present invention, the methods can increase the size of the void formed between the epitaxial layer and the substrate and can improve reproducibility in formation of the void by patterning the sacrificial layer and forming the first and second mask patterns. Accordingly, time required to chemically etch the mask patterns is reduced, thereby reducing time required for separation of the substrate while enabling large-area separation of a substrate.

In addition, as the size of the void is increased, a contact area between the substrate and the epitaxial layer is decreased. Accordingly, it is easy to separate the substrate using the stress lift-off process.

In addition, the method of fabricating a semiconductor device employs the method of separating a substrate through a large area, thereby decreasing faults in the semiconductor device fabricated by the method. Accordingly, it is possible to improve yield in manufacture of the semiconductor device, and to prevent the semiconductor device fabricated by the method from being deteriorated in efficiency and reliability.

Although the invention has been illustrated with reference to some embodiments in conjunction with the drawings, it will be apparent to those skilled in the art that various modifications and changes can be made to the invention without departing from the spirit and scope of the invention. Further, it should be understood that some features of a certain embodiment may also be applied to other embodiments without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

What is claimed is:

1. A method of separating a substrate, comprising:
    forming a first mask pattern comprising a masking region and an open region, on a substrate;
    forming a sacrificial layer covering the substrate and the first mask pattern;
    patterning the sacrificial layer to form a seed layer and to expose at least a portion of the first mask pattern;
    forming a second mask pattern on the exposed portion of the first mask pattern;
    forming an epitaxial layer on the seed layer and the second mask pattern, and forming a void between the second mask pattern and the epitaxial layer; and
    separating the substrate and the epitaxial layer.

2. The method of claim 1, wherein the seed layer is formed on a portion of the masking region.

3. The method of claim 2, wherein the seed layer is thicker than the second mask pattern.

4. The method of claim 2, wherein the epitaxial layer is grown using the seed layer as a seed.

5. The method of claim 2, wherein a width of the seed layer is smaller than a width of the masking region of the first mask pattern.

6. The method of claim 1, further comprising forming a separation layer while patterning the sacrificial layer to form the seed layer,
    wherein the separation layer is formed within the open region.

7. The method of claim 6, wherein the second mask pattern covers the separation layer.

8. The method of claim 1, wherein the separating the substrate comprises chemically etching the first and second mask patterns.

9. The method of claim 1, wherein the separating the substrate comprises applying stress between the substrate and the epitaxial layer.

10. The method of claim 1, wherein the patterning the sacrificial layer to form the seed layer comprises:
    forming an etching mask pattern on the sacrificial layer; and
    etching the sacrificial layer using the etching mask pattern as an etching mask,
    wherein the second mask pattern is formed by a lift-off process using the etching mask pattern.

11. A method of fabricating a semiconductor device, comprising:
    forming a first mask pattern comprising a masking region and an open region, on a substrate;
    forming a sacrificial layer covering the substrate and the first mask pattern;
    patterning the sacrificial layer to form a seed layer and to expose at least a portion of the first mask pattern;
    forming a second mask pattern on the exposed portion of the first mask pattern;
    forming an epitaxial layer on the seed layer and the second mask pattern, and forming a void between the second mask pattern and the epitaxial layer;
    forming a support substrate on the epitaxial layer; and
    separating the substrate from the epitaxial layer.

12. The method of claim 11, wherein the seed layer is formed on a portion of the masking region.

13. The method of claim 12, further comprising forming a separation layer within the open region, while patterning the sacrificial layer to form the seed layer.

14. The method of claim 12, wherein the seed layer is thicker than the second mask pattern.

15. The method of claim 12, wherein the epitaxial layer is grown using the seed layer as a seed.

16. The method of claim 15, wherein the epitaxial layer comprises a first nitride semiconductor layer, an active layer, and a second nitride semiconductor layer.

17. The method of claim 16, wherein the sacrificial layer comprises u-GaN or n-GaN.

18. The method of claim 11, wherein the separating the substrate comprises chemically etching the first and second mask patterns.

19. The method of claim 11, wherein the separating the substrate comprises applying stress between the substrate and the epitaxial layer.

20. The method of claim 11, further comprising forming a dividing groove by patterning the epitaxial layer before forming the support substrate,
    wherein the epitaxial layer is divided into semiconductor device regions by the dividing groove.

21. The method of claim 20, further comprising forming at least one device region dividing groove by patterning the respective semiconductor device regions, after separating the substrate,
    wherein the semiconductor device region is divided into device regions by the device region dividing groove.

22. The method of claim 11, further comprising forming a device region dividing groove by patterning the epitaxial layer, after separating the substrate,
    wherein the epitaxial layer is divided into device regions by the device region dividing groove.

23. The method of claim 21, further comprising forming light emitting diode chips by dividing the support substrate at the device region dividing groove.

* * * * *